(12) United States Patent
Ohara et al.

(10) Patent No.: US 6,168,892 B1
(45) Date of Patent: Jan. 2, 2001

(54) METHOD FOR FORMING COLOR IMAGE

(75) Inventors: Noriko Ohara; Hiroshi Kita; Masayuki Ushiku; Daisuke Ishibashi; Hisatake Okada, all of Hino (JP)

(73) Assignee: Konica Corporation, Tokyo (JP)

( * ) Notice: Under 35 U.S.C. 154(b), the term of this patent shall be extended for 0 days.

(21) Appl. No.: 09/328,530

(22) Filed: Jun. 9, 1999

(30) Foreign Application Priority Data

Jun. 15, 1998 (JP) .................................................. 10-181333
Aug. 5, 1998 (JP) .................................................. 10-232355

(51) Int. Cl.$^7$ .............................. G03G 9/09; C08K 13/00
(52) U.S. Cl. ............................ 430/45; 106/420; 106/499
(58) Field of Search .................................... 106/420, 499; 358/518; 430/45

(56) References Cited

U.S. PATENT DOCUMENTS

| | | | |
|---|---|---|---|
| 4,070,577 | 1/1978 | Lewis et al. ......................... | 250/315 |
| 4,725,316 | * 2/1988 | Mahany ............................... | 106/288 |
| 4,740,059 | * 4/1988 | Boldt .................................... | 350/317 |
| 4,953,953 | * 9/1990 | Fergason . | |
| 5,212,546 | * 5/1993 | Arazi et al. ............................ | 358/80 |
| 5,422,738 | * 6/1995 | Ishihara et al. ...................... | 358/500 |

FOREIGN PATENT DOCUMENTS 0 156 408 A1  2/1985  (EP) .
0 350 099 A1  1/1990  (EP) .
0 383 212 A2  8/1990  (EP) .

* cited by examiner

*Primary Examiner*—John Goodrow
(74) *Attorney, Agent, or Firm*—Frishauf, Holtz, Goodman, Langer & Chick, P.C.

(57) ABSTRACT

A color image forming method is disclosed, comprising applying additive color mixing to a subtractive color mixture to perform color correction. Specifically, a fluorescent substance exhibiting emission in the visible light wavelength region, which is used for the additive color mixing, is mixed with a compound having an absorption in the visible light wavelength region.

25 Claims, 4 Drawing Sheets

METHOD FOR FORMING COLOR IMAGE

FIELD OF THE INVENTION

The present invention relates to a method for forming reflection-type or transmission-type color images.

BACKGROUND OF THE INVENTION

The reflection-type or transmission type images refer to all characters and images having non-luminous object color other than light source color, including prints obtained using letterpress printing, intaglio printing or planographic printing, output by printers (e.g., an ink-jet printer, laser printer, sublimation-type thermal printer, thermal transfer printer, electrostatic printer, etc.), photographic materials, and photocopies. Hereinafter these are denoted as "hard copy". Image qualities of hard copy depend on gradation, resolution, color reproduction, and sharpness; and its color affected by the color of the image supporting material such as paper or a transparent sheet, color of dyes and composition of inks or toners. To expand the color reproduction range or improve hue or color tone in color images of these hard copies, dyes with high color purity have been explored, that is, attempts to reduce unwanted absorption, have been made, based on chemical structure, but it was proved to be limited in terms of requirements such as light fastness and manufacturing cost. Cited as the use of a fluorescent substance to improve color images is a fluorescent brightening agent. In this case, when a colorless compound having no absorption within the visible light wavelength region is employed as a fluorescent dye, the emission wavelength region is limited only to a blue color, and it effectuate to minimize an unwanted absorption of the dye but it is directed to improvements in yellowish white background. Thus, this technique is not directed to color correction. Various attempts have been made with respect to aggregation of dyes, surfactants as a component of inks or toners and light transmission property of polymers. However, these techniques have not resulted in removal of unwanted absorption of dyes.

U.S. Pat. No. 4,774,181 discloses the use of a coupler capable of releasing a fluorescent compound, in which case the coupler was previously included in a photographic material and the fluorescent compound is formed after processing such as development. On the contrary, according to the present invention, a fluorescent material is imagewise sprayed or transferred onto the color image portions, which is distinctly different from the technique described above. Furthermore, the above-described fluorescent compound-releasing coupler was proved to be inferior in storage stability and commercially unacceptable.

It is also known in the art that a fluorescent substance is included in a hard copy for the purpose of antifalsification, in which case the fluorescent substance exhibits no emission in the visible region under conventional light such as natural light or fluorescent light, and emitting light only under irradiation of UV rays. There is also known an ink emitting fluorescence, causing the resulting images to appear to be excessively vibrant or visually impact on the images.

Along with advancements of digitization, color hue and color reproduction range of hard copy are sought to approach the quality of CRT.

The concept of employing the subtractive color process and additive color process in combination is applied to displays, in which case a fluorescent substance is covered with a filter to remove unwanted emissions, enhancing color purity. Thus, it serves to correct images formed by additive color mixing with subtractive color mixing. However there has not been known any concept of applying the additive color process to images formed through subtractive color mixing to perform imagewise color correction.

SUMMARY OF THE INVENTION

Accordingly, an object of the present invention is to provide a method for forming color images with improved color hue and expanded color reproduction region.

The above object of the present invention is accomplished by the following constitution:

(1) a color image forming method comprising applying additive color mixing to a subtractive color mixture to perform color correction;

(2) the method described in (1) above, wherein a fluorescent substance is used for the additive color mixing;

(3) the method described in (2) above, wherein a fluorescent substance exhibiting emission in the visible light wavelength region is mixed with a compound having an absorption in the visible light wavelength region to form a mixture;

(4) the method described in (3) above, wherein the fluorescent substance is mixed in an amount that gives not less than −0.3 with respect to an absorbance of the mixture;

(5) the method described in (3) or (4) above, wherein the compound having an absorption in the visible region is a colorant;

(6) the method described in any of (3) to (5) above, wherein the fluorescent substance exhibits emission in the wavelength region of an unwanted absorption of the compound having an absorption in the visible region;

(7) the method described in any of (3) to (5) above, wherein the fluorescent substance is so mixed that an absorption in an unwanted absorption wavelength region is reduced to not more than 98% by area;

(8) the method described in any of (3) to (5) above, wherein the compound having an absorption in the visible region has a main absorption peak and an absorption peak in an unwanted wavelength region, and the fluorescent substance is so mixed that the absorption peak in an unwanted wavelength region is reduced to not more than 98% by height;

(9) the method described in any of (3) to (5) above, wherein the compound having an absorption in the visible region has a single absoption peak, including absorption in an unwanted wavelength region, and the fluorescent substance is so mixed that a half-width of the absorption of the compound is reduced to not more than 99.5%;

(10) the method described in any of (3) to (9) above, wherein the exciting light wavelength of the fluorescent substance is in the range of 350 to 420 nm;

(11) the method described in any of (2) to (10) above, wherein the fluorescent substance exhibits an emission having a peak at a wavelength of 400 to 500 nm;

(12) the method described in any of (2) to (10) above, wherein the fluorescent substance exhibits an emission having a peak at a wavelength of 500 to 600 nm;

(13) the method described in any of (2) to (10) above, wherein the fluorescent substance exhibits an emission having a peak at a wavelength of 600 to 700 nm;

(14) the method described in any of (2) to (13) above, wherein the fluorescent substance exhibits an emission having a Stokes shift of not less than 10 nm;

(15) the method described of (11) above, wherein the fluorescent substance exhibits an emission having a Stokes shift of 10 to 100 nm;

(16) the method described of (12) above, wherein the fluorescent substance exhibits an emission having a Stokes shift of 100 to 200 nm;

(17) the method described of (13) above, wherein the fluorescent substance exhibits an emission having a Stokes shift of 200 to 300 nm;

(18) the method described in any of (5) to (10) above, wherein the colorant is yellow, and the fluorescent substance is so mixed that an absorption in the wavelength region of not less than 500 nm is reduced to not more than 98%;

(19) the method described in any of (5) to (10) above, wherein the colorant is magenta, and the fluorescent substance is so mixed that an absorption in the wavelength region except for 500 to 600 nm is reduced to not more than 98%;

(20) the method described in any of (5) to (10) above, wherein the colorant exhibits cyan color, and the fluorescent substance is so mixed that an absorption in the wavelength region of not more than 600 nm is reduced to not more than 98%;

(21) the method described in any of (2) to (20) above, wherein the fluorescent substance is an inorganic phosphor;

(22) the method described in any of (2) to (21) above, wherein the fluorescent substance contains at least an oxygen atom;

(23) a color image forming method comprising forming plural picture elements on a support, wherein the picture elements each comprise a fluorescent substance and a colorant;

(24) a color image forming method comprising:
  (a) preparing an image forming material and
  (b) imagewise providing the prepared image forming material onto a support,
wherein the image forming material comprises a fluorescent substance and a colorant;

(25) the method described in (24), wherein the step (b) comprises transferring the image forming material onto a support;

(26) the method described in (24) or (25), wherein the step (b) comprises at least one of the following (c) to (h):
  (c) allowing an organic photoconductor to be charged,
  (d) exposing an organic photoconductor to light,
  (e) allowing the image forming material to be adsorbed onto an organic photoconductor,
  (f) allowing the image forming material to transfer from an organic photoconductor to an intermediate receiving material,
  (g) (c), (d) or (e) being conducted for each of yellow, magenta, cyan and black colors, and
  (h) allowing the image forming material on the intermediate receiving material to transfer onto a support;

(27) the method described in (24), wherein the step (b) comprises spraying the image forming material on a support;

(28) the method described in (24) or (27), wherein step (b) comprises at least one of the following (i), (j) and (k):
  (i) ejecting the image forming material through a nozzle of a recording head,
  (j) allowing the ejected image forming material to adsorb onto a support, and
  (k) (i) or (j) being conducted for each of yellow, magenta, cyan and black colors.

DETAILED DESCRIPTION OF THE INVENTION

Color correction in this invention is to vary at least one of the following: an absorbance of a dye, the absorption spectrum form, the half-width, the absorption peak, color purity, lightness, and chroma (or saturation), including changing the hue of a dye, reducing unwanted absorption and varying the color reproduction region. Color purity may be enhanced or lowered, and the color reproduction region may be expanded or reduced. Color purity is referred to as the ratio of the absorption peak to other absorption wavelengths. Color comprised of the wavelengths at the absorption peak, or close to the peak, exhibits high color purity. The color reproduction region in this invention refers to the color-formable region of a color image, such as the color space represented by CIE chromaticity diagram (JIS Z-8721) and the color-formable region represented by $L^*a^*b^*$ space which can be determined by the method defined in JIS Z-8722 (Measurement of Non-Luminous Object Color).

Expanding the color reproduction region according to this invention means expanding the color reproduction region by using a fluorescent substance, i.e.,broadening the area color-formable region in the CIE chromaticity diagram or enlarging the volume of $L^*a^*b^*$ space.

Variation of hue in this invention means variation of the primary absorption peak wavelength, which can be determined by measuring the reflection or transmittance spectrum of a hard copy. The hard copy is conventionally comprised of a subtractive mixture of yellow, magenta and cyan dyes. Inherent absorption of a dye directly affects formed color images. In cases where a dye has a side absorption, it was impossible to further enhance color purity. However, it is possible to cancel the side-absorption by adding thereto a fluorescent substance exhibiting emission at the wavelengths corresponding to the side-absorption.

Figure 1:
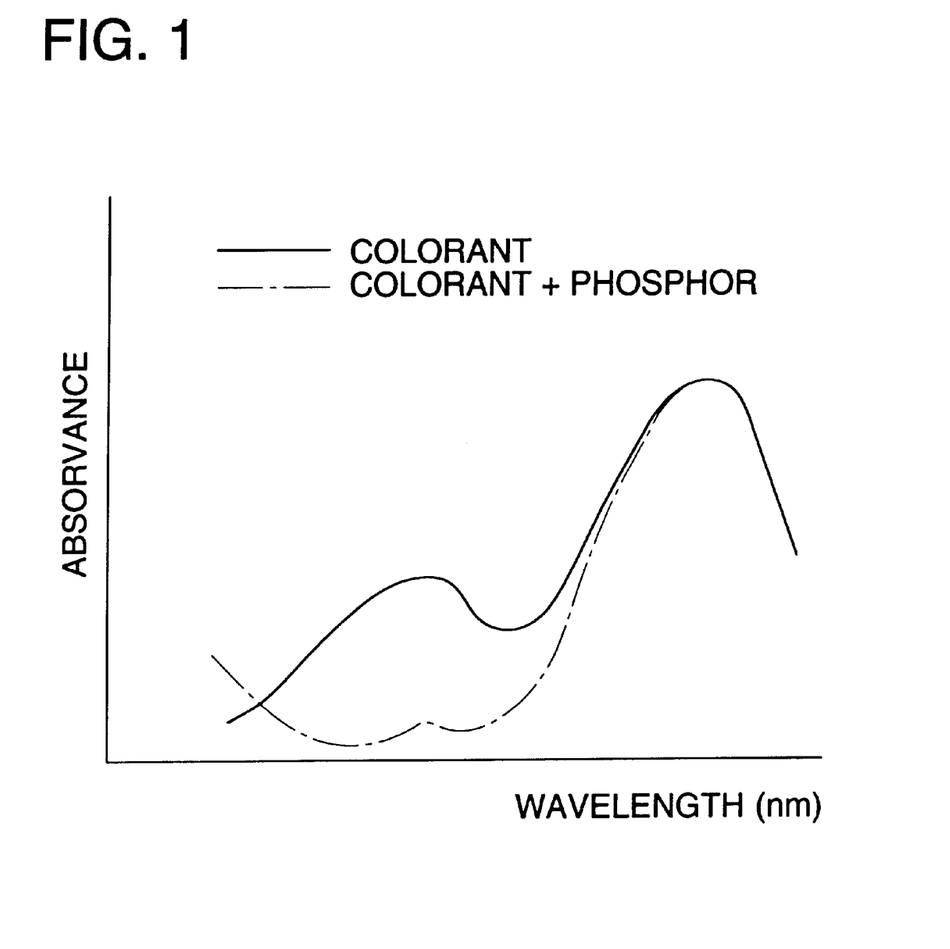
FIGS. 1 to 4 each show absorptions of a colorant alone, and a colorant in combination with a phosphor.

According to this invention, the compound having light absorption in the visible region (e.g., a colorant) and the fluorescent substance exhibiting light emission in the visible region can be mixed in any amounts or in any ratio. FIG. 1 shows an absorption spectrum of a colorant alone, or of a colorant in combination with a fluorescent substance. As illustrated in FIG. 1, the fluorescent substance is so mixed that absorption of the resulting mixture is preferably not less than minus 0.3 with respect to absorbance at any wavelength, more preferably not less than minum 0.1, and still more preferably not less than 0.0. The preferable amounts or ratio depend on the combination of the compound and fluorescent substance, and in each case, it is preferred to satisfy the requirement described above. The fluorescent substance may be used alone or in combination. Thus, one or more fluorescent substances can be employed to obtain the desired emission. The fluorescent substance may be incorporated into a colorant such as an ink or toner. It may be uniformly coated on a support, in which case, a mixture of two or more fluorescent substances different in emission peak by 30 nm or more, is preferably used.

According to this invention, the unwanted absorption wavelength region is the magenta and cyan color regions for the yellow color region, the yellow and cyan color regions for the magenta color region, and the yellow and magenta color regions for the cyan color region. Thus, the unwanted absorption wavelength region is in the wavelength region of 500 nm or more for yellow color; in the region of 500 nm or less, and 600 nm or more for magenta color; and in the region of 600 nm or less for cyan color.

Figure 2:
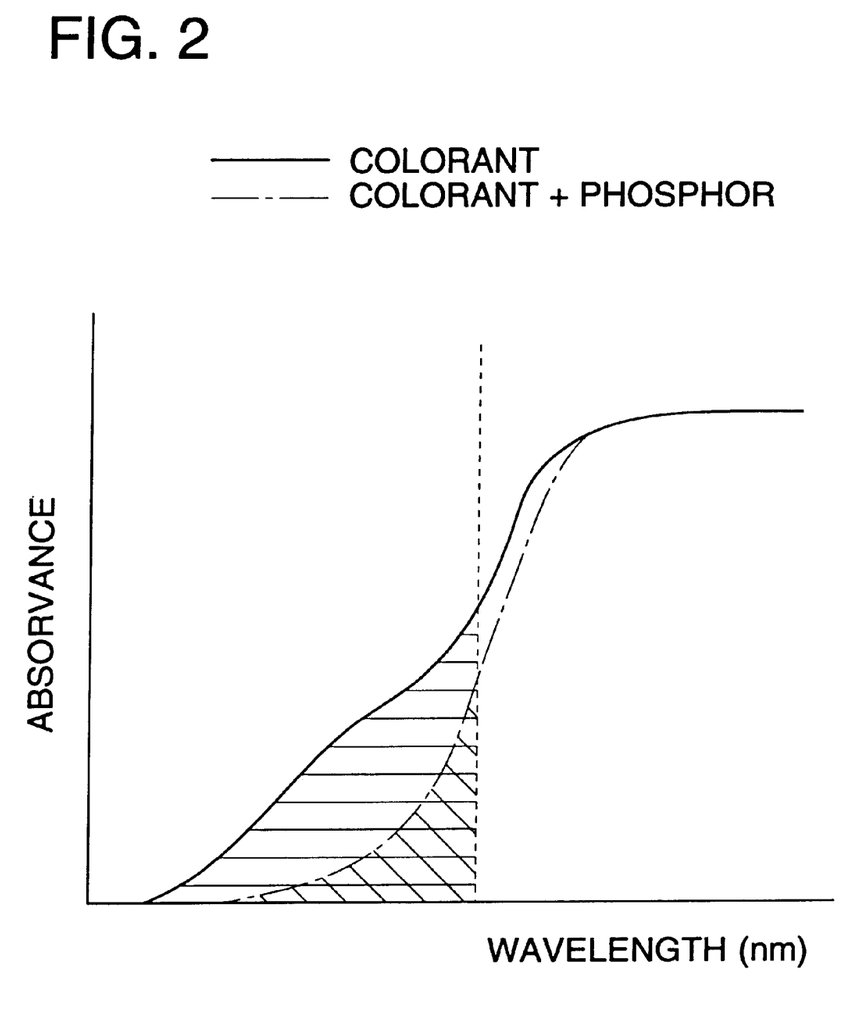

In this invention, the expression "an absorption in an unwanted absorption wavelength region is reduced to not more than 98% by area" means that in cases of cyan, for example, an absorption in the wavelengths of 600 nm or less is reduced to not more than 98% by area, preferably not more than 95% by area, and still more preferably not more than 93% by area, as illustrated in FIG. 2. Thus, incorporation of a fluorescent substance (e.g., a phosphor) into the compound having absorption in the visible region (e.g., a colorant) results in reduced absorption in the specified wavelength region.

Figure 3:
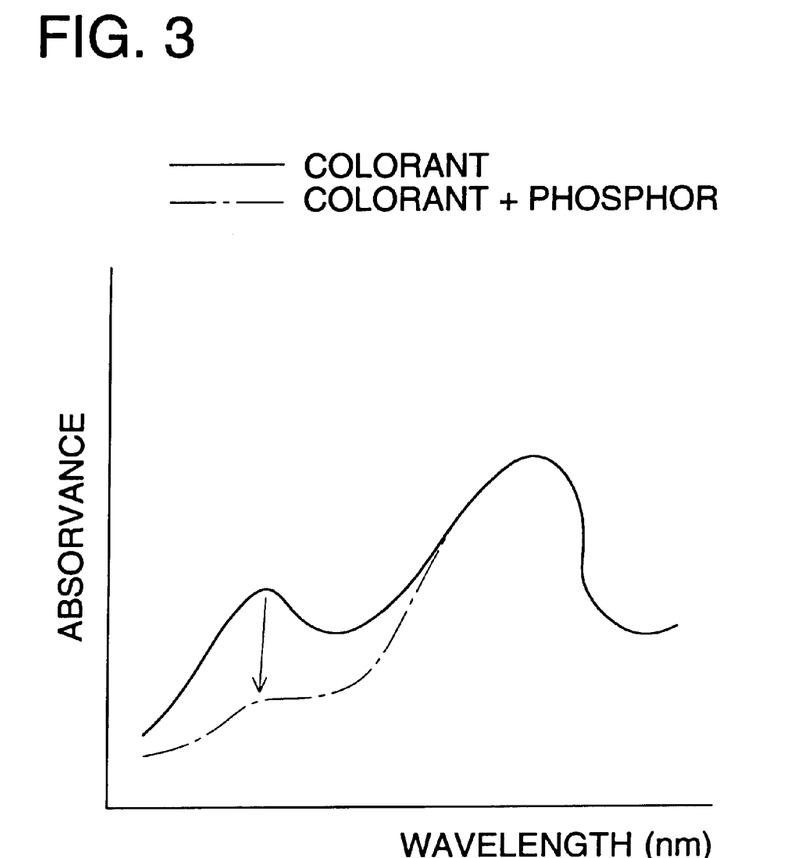

When the compound having an absorption in the visible region exhibits an absorption including a main absorption peak and an absorption peak in an unwanted wavelength region, it is preferred to further incorporate a fluorescent substance thereto so that the absorption peak in the unwanted wavelength region is reduced to not more than 98% by (peak) height, more preferably to not more than 95%, and still more preferably to not more than 93%, as illustrated in FIG. 3.. Exemplarily, in cases of cyan, the side absorption peak height at the wavelengths of not more than 600 nm is reduced preferably to not more than 98% by height, more preferably not more than 95%, and still more preferably not more than 95%.

Figure 4:
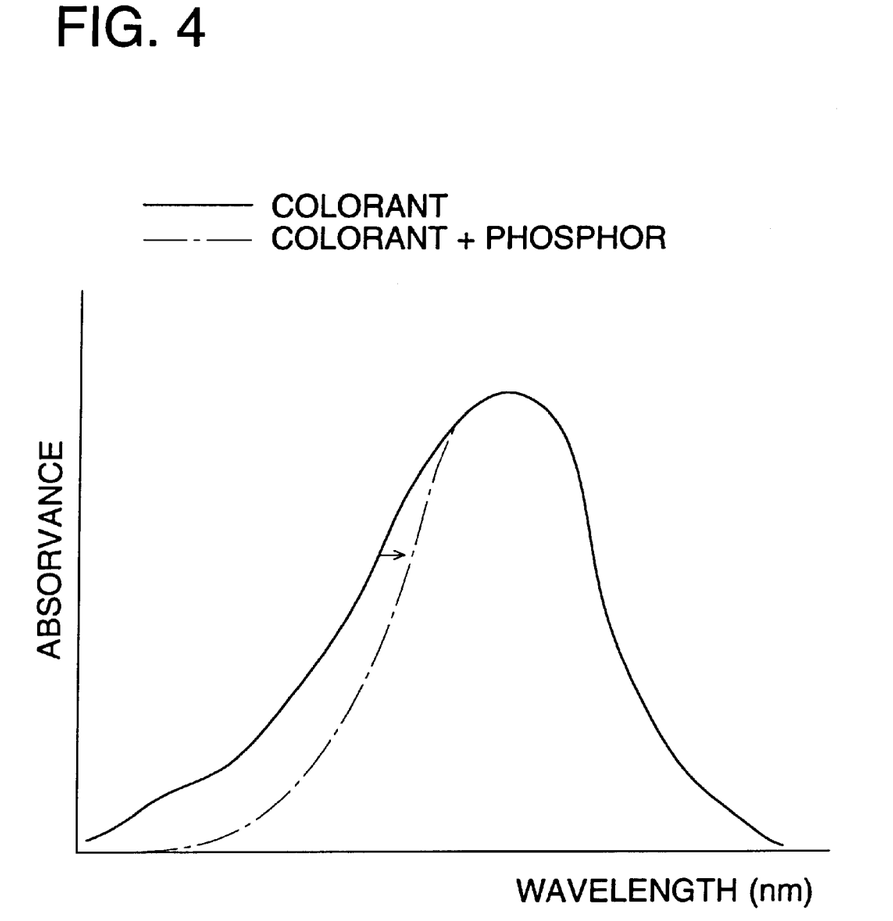

When the compound having an absorption in the visible region exhibit an absorption with a single peak and including the unwanted wavelength region, it is also preferred to further incorporate a fluorescent substance thereto so that the half-width of the absorption is reduced to not more than 99.5%, more preferably not more than 99%, and still more preferably not more than 98%. As illustrated in FIG. 4, in cases of cyan, for example, the half-width of the absorption is reduced preferably not more than 99.5% (more preferably not more than 99%, and still more preferably not more than 98%), leading to reduction of the unwanted absorption in the region of not more than 600 nm.

The exciting wavelength of the fluorescent substance used in this invention is preferably in the UV region and may be in the visible region, unless image formation is adversely affected. Specifically, the exciting wavelength is preferably 300 to 450 nm, and more preferably 350 to 420 nm. Color correction may be effectuated by irradiating a black light together with an incandescent lamp, fluorescent lamp or day light, and it is effectuated preferably under visible light of 350 to 420 nm (e.g., incandescent lamp, fluorescent lamp, day light).

Fluorescent substances usable in this invention include organic phosphors and inorganic phosphors. Examples of organic phosphors include Brilliantsulfoflavine FF, Basic Yellow HG, Rhodamine 6G, pyrene compounds such as sodium pyrenesulfonate, sodium pyrenetetrasulfonate and their hydroxy-substituted, amino-substituted or acetoamido-substituted derivatives, C.I. Basic Red 1, C.I. Basic Red 2, C.I. Basic Red 9, C.I. Basic Red12, C.I. Basic Red 13, C.I. Basic Red 14, C.I. Basic Red 17, C.I. Acid Red 51, C.I. Acid Red 52, C.I. Acid Red92, C.I. Acid Red, C.I. Basic Violet 1, C.I. Basic Violet 3, C.I. Basic Violet 7, C.I. Basic Violet 10, and C.I. Basic Violet 14.

Compositions of inorganic phosphors used in this invention are described in JP-A 50-6410, 61-65226, 64-22987, 64-60671 and 1-168911 (hereinafter, the term, JP-A means an unexamined and published Japanese Patent Application). A combination of mother crystal of a metal oxide [e.g., $Y_2O_2S$, $Zn_2SiO_4$, $Ca_5(PO_4)_3Cl$] or sulfide (e.g., ZnS, SrS, CaS), and an activator or co-activator, such as a rare earth metal ion (e.g., Ce, Pr, Nd, Pm, Sm, Eu, Gd, Tb, Dy, Ho, Er, Tm, Yb) or a metal ion (e.g., Ag, Al, Mn, Sb) is preferably used. Preferred examples of mother crystal include ZnS, $Y_2O_2S$, $Y_3Al_5O_{12}$, $Y_2SiO_3$, $Zn_2SiO_4$, $Y_2O_3$, $BaMgAl_{10}O_{17}$, $BaAl_{12}O_{19}$, (Ba, Sr, Mg)O·a$Al_2O_3$, (Y, Gd)$BO_3$, $YO_3$, (Zn, Cd)S, $SrGa_2S_4$, SrS, GaS, $SnO_2$, $Ca_{10}(PO_4)_6(F,Cl)_2$, (Ba, Sr)(Mg, Mn)$Al_{10}O_{17}$, (Sr, Ca, Ba, Mg)$_{10}(PO_4)_6Cl_2$, (La,Ce)$PO_4$, $CeMgAl_{11}O_{19}$, $GdMgB_5O_{10}$, $Sr_2P_2O_7$ and $Sr_4Al_{14}O_{25}$. The mother crystal and activator or co-activator may be partially replaced by another element of the same group. Elemental composition is not specifically limited and any phosphor absorbing in the uv to visible region and emitting in the visible region may be usable.

Exemplary preferred inorganic phosphors are shown below, but are not limited to these examples.

Blue-emissive phosphor:
(BL-1) $Sr_2P_2O_7:Sn^{4+}$
(BL-2) $Sr_4Al_{14}O25:Eu^{2+}$
(BL-3) $BaMgAl_{10}O_{17}:Eu^{2+}$
(BL-4) $SrGa_2S_4: Ce^{3+}$
(BL-5) $CaGa_2S_4: Ce^{3+}$
(BL-6) (Ba, Sr) (Mg, Mn)$Al_{10}O_{17}:EU^{2+}$
(BL-7) (Sr, Ca, Ba, Mg)$_{10}(PO_4)_6Cl_2:Eu^{3+}$
(BL-8) ZnS:Ag
(BL-9) $CaWO_4$
(BL-10) $Y_2SiO_5$:Ce
(BL-11) ZnS:Ag,Ga,Cl
(BL-12) $Ca_2B_5O_9Cl:Eu^{2+}$
(BL-13) $BaMgAl_{14}O_{23}: Eu^{2+}$ Green-emissive phosphor:
(GF-1) (BaMg)$Al_{16}O_{27}:Eu^{2+}$, $Mn^{2+}$
(GF-2) $Sr_4Al_{14}O_{25}:Eu^{2+}$
(GF-3) (SrBa)$Al_2Si_2O_8:Eu^{2+}$
(GF-4) (BaMg)$_2SiO_4: Eu^{2+}$
(GF-5) $Y_2SiO_5:Ce^{3+}$, $Tb^{3+}$
(GF-6) $Sr_2P_2O_7$-$Sr_2B_2O_5: Eu^{2+}$
(GF-7) (BaCaMg)$_5(PO_4)_3Cl:Eu^{2+}$
(GF-8) $Sr_2Si_3O_8$-$2SrCl_2:Eu^{2+}$
(GF-9) $Zr_2SiO_4$, $MgAl_{11}O_{19}:Ce^{3+}$, ,$Tb^{3+}$
(GF-10) $Ba_2SiO_4:Eu^{2+}$
(GF-11) ZnS:Cu,Al
(GF-12) (Zn,Cd)S:Cu,Al
(GF-13) ZnS:Cu,Au,Al
(GF-14) $Zn_2SiO_4$:Mn
(GF-15) ZnS:Ag,Cu
(GF-16) (Zn,Cd)S:Cu
(GF-17) ZnS:Cu
(GF-18) $Gd_2O_2S$:Tb
(GF-19) $La_2O_2S$:Tb
(GF-20) $Y_2SiO_5$:Ce, Tb
(GF-21) $Zn_2GeO_4$:Mn
(GF-22) $CeMgAl_{11}O_{19}$:Tb
(GF-23) $SrGa_2S_4:Eu^{2+}$
(GF-24) ZnS:Cu,Co
(GF-25) $MgO·nB_2O_3$:Ce,Tb (GF-26) LaOBr:Tb,Tm
(GF-27) La$_2$O$_2$S:Tb Red-emissive Phosphor (RL-1) Y$_2$O$_2$S:Eu$^{3+}$
(RL-2) (BaMg)$_2$SiO$_4$:Eu$^{3+}$
(RL-3) (BaMg)Al$_{16}$O$_{27}$:Eu$^{3+}$
(RL-4) (BaCaMg)$_5$(PO$_4$)$_3$Cl:Eu$^{3+}$
(RL-5) YVO$_4$: Eu$^{3+}$
(RL-6) CaS:Eu$^{3+}$
(RL-7) Y$_2$O$_3$:Eu
(RL-8) 3.5MgO,0.5MgF$_2$GeO$_2$:Mn
(RL-9) (Y,Cd)BO$_3$:Eu Phosphors used in three-wavelength type fluorescent lamp and calcium halophosphate are also cited. Of inorganic phosphors, inorganic oxide phosphors and inorganic halide phosphors are preferred, and specifically, inorganic oxide phosphors are more preferred.

Of preferred inorganic phosphors are specifically preferred inorganic phosphors exhibiting Stokes shift with superior emission efficiency. The shift value is preferably 10 nm or more, more preferably 20 nm or more, and still more preferably 30 nm or more. Exemplarily, in cases of an unwanted absorption range of 400 to 500 nm, the Stokes shift is preferably 10 to 100 nm; in cases of an unwanted absorption if 500 to 600 nm, the Stokes shift is preferably 100 to 200 nm; and in cases of an unwanted absorption of 600 to 700 nm, the Stokes shift is preferably 200 to 300 nm.

The emission wavelength of phosphors is preferably 500 to 600 nm or 600 to 700 nm for yellow, 400 to 500 nm or 600 to 700 nm for magenta, and 400 to 500 nm or 500 to 600 nm for cyan.

Emission spectrum may be broad or sharp, and preferably covers all of the unwanted absorption region. If color correction is made, a part of the unwanted absorption may remain. For example, it may allow to emit specifically only within the region high in human luminosity factor.

Inorganic phosphors having little effects on environment and human body are preferred, which can be manufactured in accordance with methods known in the art. Phosphors which have not subjected to a grinding process, i.e., those prepared by the build-up method are preferred in terms of emission intensity. Specifically phosphors prepared through a liquid phase process such as a sol-gel method are preferred. The sol-gel method is a preparation method in which a double alkoxide prepared by adding elements (metals) used in mother crystal or an activator to a metal alkoxide such as Si(OCH$_3$)$_4$ or Eu$^{3+}$(CH$_3$COCH=C(O)CH$_3$)$_3$ or metal complex {e.g., Mg[Al(OBu)$_3$]$_2$ prepared by adding magnesium metal to a 2-butanol solution of Al(OBu)$_3$}; an organic acid metal salt, and a metal are mixed and subjected to thermal or chemical polycondensation; and optionally further subjected to calcination or reducing treatment. In cases when prepared by the sol-gel method, a phosphor precursor solution or a solution containing primary particles may be patternizedly coated onto a transparent board by the printing method or ink-jet method and then subjected to calcination or reducing treatment.

The inorganic phosphors described above may further be treated with a surface-modifying agent, surfactant, or a matting agent such as fine silica gel particles, aerogyl or alumina to modify the particle surface or improve dispersibility.

Conventional dyes known in the art can be employed to form color images through subtractive color mixing according to this invention. Exemplary preferred dyes include:

dyes used as a photochromic dye, such as benzene azo type, spiropyran type, fulgide type, diarylethene type, dihydropyren type, benzothiospiropyran type, spirocoumarinopyran, spiroindoline, spirothiazine, naphthacene derivatives, porphyrin type, polymethine type, polydiacetylene type, thiophenoxysulfonium tetraborate, thioindigo type, succinate dialkyl esters, hexaphenylimidazolyl;

dyes used for toners including carbon black, benzidine yellow, diphenylmethane type dyes, quinacridone, rhodamine, Phthalocyanine Blue, Oil Blue, Alkali Blue, Phthalocyanine Green, indophenol type dyes, phthalocyanine type dyes, azo type dyes, anthraquinone type dyes, Nigrosine dye, Aniline Blue, Chalcoyl Blue, Chrome Yellow, Ultramarine Blue, du Pont Oil Red, Quinoline Yellow, Methylene Blue Chloride, Phthalocyanine Blue, Malakite Green Oxalate, Rose Bengal;

dyes used for pressure-sensitive or heat-sensitive materials, including triphenylmethane-phthalide type, fluoran type, phenothiazine type, indolylphthalide type, Leucoauramine type, spiropyran type, rhodamine lactam type, triphenymethane type, thiofuran type, xanthene type, methine type, aminophenylpentadiene type, benzopyran type, e.g., CVL, BLMO, ODB, Red-2, S-205, ATP, DEBW, PSD-P, -V, -O, -HR, -G, 150 and -170, TH-106 and 107;

dyes used in thermal transfer materials, including azo type, anthraquinone type, azomethine type, methine type, indoaniline type, spiro type;

dyes used in sublimation type thermal transfer materials, including CI Disperse Yellow 54, CI Disperse Red 60, CI Disperse Blue 14;

dyes used in fusion type thermal transfer materials, including yellow dyes such as Chrome Yellow (yellow lead), Zinc Cholomade (zinc yellow), Lemon Yellow (barium chromate), Cadmium Yellow, Naphthol Yellow S, Hanza Yellow 5G, Hanza Yellow 3G, Hanza Yellow G, Hanza Yellow A, Hanza Yellow RN, Hanza Yellow R, Hanza Yellow, Benzine Yellow G, Benzine Yellow GR, Permanent Yellow NGG, Quinoline Yellow Lake; magenta dyes such as Permanent Red 4R, Brilliant First Scarlet., Brilliant Carmin BS, Permanent Carmin FB, Lisole Red, Permanent Red F5R, Brilliant carmin 6B, Pigment Scarlet 3B, Rhodamine Lake B, Rhodamine Lake Y, Alizarin Lake, Rhodamine; cyan dyes such as Victoria Blue lake, no metal Phthalocyanine Blue, Phthalocyanine Blue, First Sky blue, Victoria Blue;

aqueous-soluble dyes used in ink-jet including yellow dyes such as CI Direct Yellow 12, 27, 33, 39, 50, 58, 85,86, 88, 100 and 110, CI Acid Yellow 7, 17, 23, 29, 42, and 99; magenta dyes such as CI Direct Red 1, 11, 37, 62, 75, 83, 99, 220 and 227, CI Acid red 35, 87, 92, 94, 115, 131, 154, 86, 254 and 265; and cyan dyes such as CI direct Blue 1, 2, 6; 8, 15, 22, 25, 71, 76, 78, 86, 90, 98, 108, 120, 192–196, 199200–203, 207, 236 and 237, CI Acid Blue 1,7, 9, 23, 43, 78, 82, 127, 234, and 236; black dyes such as CI Direct Black 2, 4, 17, 19, 22, 32, 38, 51, 56, 62, 71, 74, 77, 105, 108, 112, 154, and 168, CI Acid Black 1, 2, 7, 24, 31, 52 and 94, CI Food Black 1 and 2;

oil-soluble dyes used in ink-jet including (Yellow type) Solvent Yellow 19, 21, 61 and 80; (Orange type) Solvent Orange 1, 37 and 40; (Red type) Solvent Red 8, 81, 82, 84 and 100 (Pink type) Diaresin Pink M, Sumiplast Pink R·FF; (Violet type) Solvent Violet 8 and 21; (blue type) Solvent Blue 2, 11, 25 and 36; (Green type) Solvent Green 3; )Brown type) Solvent Brown 3, Diaresin Brown A; )black type) Solvent Black 3, 5, 7 and 22;

dyes used in polarizing films including quinophthalocyanine type, naphthoquinone type, anthraquinone type, perylene type, azo type dyes used in light disk, including cyanine type, azulenium type, naphthalocyanine type, naphthoquinone type, indoaniline type, benzenethiol type, diamine type, diaminonaphthoquinone type, naphthalenedicarboxylic acid diamide type, benzene thiol metal complexes, diamine metal complexes, indoaniline metal complexes, tetrakisaminophenylbenzene, bithienylidene bisazobenzene, benzothiopyrilium, squalium, benzenediolate ethylphosphonium metal complexes, phthalide compounds, pentaphenylpentadiene and its condensate, fluorene derivatives, pentadiene;

dyes used in PHB (Photochemical Hole Burning), including chlorine, quinizaline, carbazole type, dimethyl-s-tetrazine, tetraporphyrin derivatives;

dyes capable of forming a complex with metals of Ni, Cu, Co, Zn, Cr, Pt, Pd and Fe, and metal complex precursors, described in Japanese Patent Application No. 9-261904 and 8-092478; and dyes used in photographic materials, including dye precursor and dyes formed upon coupling with a developing agent, described in JP-A 3-214103, 3-220502, 2-156203, 2-127603 and 7-159610.

The absorption region of a dye, a binder, a surfactant, and a polymer preferably overlap exciting wavelengths of the fluorescent substance. The fluorescent substance may be in the vicinity of the surface of a hard copy or in the interior thereof.

The color image forming method according to this invention is applicable to any transmission-type or reflection type hard copy. The transmission-type hard copy is one used for appreciating, through transmitting light, images provided on a light-transmissive support; and the reflection-type hard copy is one used for appreciating, through reflected light, images provided on a reflective support.

An image supporting material used in this invention is a support itself or a support having thereon an image forming layer containing a colorant. Further thereon or on the opposite side, an antistatic layer or various kinds of layers may be provided.

Examples of the support used in this invention include baryta paper, paper laminated with resin such as α-olefin polymer, paper support in which a resin layer can be easily peeled off from the paper support, synthetic paper, cellulose acetate, polystyrene, polyvinyl chloride, polyethylene terephthalate, polycarbonate, polyamide, polyethylene sulfon, ARTON, semi-synthetic or synthetic polymer films, glass, metals, tiles and porcelain.

In this invention, the picture element means a unit in forming images with an image forming material. The expression "imagewise" indicates the state in which image forming material is present on a image supporting material in response to the density or color tone of images desired to be formed.

The color image forming method according to this invention include a transfer type or spraying type. The transfer type includes printing such as letterpress printing, intaglio printing and planographic printing, and transfer printer; specifically, it comprises all or a part of the steps : (1) allowing an organic photoconductor (OPC) to be charged, (2) exposing the OPC to light, (3) allowing the image forming material to be adsorbed onto the OPC, (4) allowing the image forming material to transfer from the OPC to an intermediate receiving material, (5) steps (1) to (4) being conducted for each of yellow, magenta, cyan and black colors, and (6) allowing the image forming material on the intermediate receiving material to transfer onto a support. Exemplary examples thereof include a laser printer and electrophotography.

On the other hand, the spraying type comprises all or a part of the steps: (1) ejecting the image forming material through a nozzle of a recording head, (2) allowing the ejected image forming material to adsorb onto a support, and (3) steps (1) and (2) being conducted for each of yellow, magenta, cyan and black colors. Exemplary examples thereof include ink-jet and toner-jet.

EXAMPLES

The present invention will be further explained based on examples, but the invention is not limited to these examples.

Example 1

Image sample 1-1 having a yellow color, magenta color, cyan color and a mixed color of yellow, magenta and cyan was prepared, using a color laser printer, KL-2010 (available from Konica Corp.), genuine toners (benzidine type yellow tone, quinacridone type magenta toner and copper phthalocyanine type cyan toner), genuine driver, Konica copying paper and an output image ISO/JIS-SCID sample S7 to S10 as output images. Image samples 1-2 and 1-3 were prepared in a manner similar to sample 1-1, provided that the a cyan toner, into which a phosphor having an emission peak at 350 nm or 502 nm was further incorporated, was used. The thus obtained image samples were visually evaluated, and the color reproduction range volume in the L*a*b* color space was determined for each sample, according to the following measuring and calculating methods:

Excitation value direct reading method

Measurement method; Sa (Double beam)

Color matching function; $X_{10}Y_{10}Z_{10}$ color system (View angle of 10°)

Standard light source; $D_{50}$ (Fluorescent lamp)

Geometrical conditions of illumination and light receiving; 0–45

Calculation of three excitation values; W10

Measurement instrument; X-Rite 938

Wavelength; 400 to 700 nm.

From the thus obtained color reproduction range volume in the L*a*b* color space was determined an increment in the color reproduction range volume of samples 1-2 or 1-3, represented by %, based on sample 1-1. The results thereof are shown in Table 1-1 below.

TABLE 1-1

| Sample No. | Phosphor (emission peak) | Increment in L*a*b* space |
|---|---|---|
| 1-1 (Comp) | — | 0 (%) |
| 1-2 (Comp) | 350 nm | 0 |
| 1-3 (Inv) | 502 nm | 14.2 |

As can be seen from Table 1-1, incorporation of a phosphor having an emission peak in the visible region (502 nm) increased the color reproduction region, resulting in brightly and clearly colored images.

Further, image samples 1-4 to 1-6 were prepared in a manner similar to sample 1-3, provided that the amount of the incorporated phosphor having an emission peak at 505 nm was varied, based on the toner. Samples were similarly evaluated and the results thereof are shown in Table 1-2.

TABLE 1-2

| Sample | Phosphor | | Minimum | Increment in |
|---|---|---|---|---|
| No. | Emission | Amount | absorbance | L*a*b* space |
| 1-4 (Inv) | 502 (nm) | 6 (%) | −0.32 | 5.2 (%) |
| 1-3 (Inv) | 502 | 5 | −0.22 | 14.2 |
| 1-5 (Inv) | 502 | 3 | 0.03 | 5.8 |
| 1-6 (Inv) | 502 | 1 | 0.2 | 3.1 |

As can be seen from Table 1-2, when the minimum absorbance was not less than −0.3, desirable color correction effects were marked.

Furthermore, image samples 1-7 and 1-8 were prepared in a manner similar to sample 1-3, provided that a phosphor having an emission peak at 505 nm was replaced by a phosphor having a different emission peak. Samples were similarly evaluated and the results thereof are shown in Table 1-3.

TABLE 1-3

| Sample No. | Phosphor Emission | Peak height of Unwanted Absorption | Increment in L*a*b* space |
|---|---|---|---|
| 1-3 (Inv) | 502 (nm) | 97 (%) | 14.2 (%) |
| 1-7 (Inv) | 450 | 99 | 5.8 |
| 1-8 (Inv) | 400 | 100 | 2.3 |

As can be seen from Table 1-3, when a phosphor exhibiting emission in the unwanted absorption region of the colorant (cyan toner) was incorporated so that the peak height of the unwanted absorption was 98% or less, based on that of the colorant, brightly and clearly colored images were obtained.

Image samples 1-9 was prepared in a manner similar to sample 1-6, provided that the phosphor was replaced by another phosphor having a different excitation peak. Samples were similarly evaluated and the results thereof are shown in Table 1-4.

TABLE 1-4

| Sample | Phosphor | | Increment in |
|---|---|---|---|
| No. | Excitation | Emission | L*a*b* space |
| 1-1 (Comp) | — | — | 0 (%) |
| 1-6 (Inv) | 405 (nm) | 502 (nm) | 14.2 |
| 1-9 (Inv) | 254 | 500 | 0 |

As can be seen from Table 1-4, incorporation of a phosphor having an excitation peak at the wavelength of 350 to 420 nm exhibited emission even under natural light such as sun light or fluorescent lamp, leading to expanded color reproduction region.

Example 2

Image samples 2-1 to 2-3 were prepared in a manner similar to sample 1-1 of Example 1, provided that a phosphor having an excitation peak at 405 nm and an emission peak at 502 nm was further incorporated into the cyan toner. Samples were evaluated similarly to Example 1 and the results thereof are shown in Table 2-1.

TABLE 2-1

| Sample | Phosphor | | | Peak Height of Unwanted Abs. | Increment in L*a*b* space |
|---|---|---|---|---|---|
| No. | Excitation | Emission | Amount | | |
| 2-1 (Inv) | 405 (nm) | 502 (nm) | 1 (%) | 99 (%) | 3.1 (%) |
| 2-2 (Inv) | 405 | 502 | 3 | 97 | 9.2 |
| 2-3 (Inv) | 405 | 502 | 5 | 95 | 14.2 |

As can be seen from Table 2-1, when the amount of the phosphor was varied so that the peak height of the unwanted absorption was 98% or less, based on that of the colorant, the color reproduction region was markedly expanded.

Similarly, sample 2-4 to 2-6 were prepared and evaluated, as shown in Table 2-2.

TABLE 2-2

| Sample | Phosphor | | | Half-width of Absorption | Increment in L*a*b* space |
|---|---|---|---|---|---|
| No. | Excitation | Emission | Amount | | |
| 2-4 (Inv) | 405 (nm) | 502 (nm) | 1 (%) | 99.8 (%) | 3.1 (%) |
| 2-5 (Inv) | 405 | 502 | 3 | 99.2 | 9.2 |
| 2-6 (Inv) | 405 | 502 | 5 | 98.0 | 14.2 |

As can be seen from Table 2-2, when the amount of the phosphor was varied so that a half-width of the primary of absorption was 98% or less, based on that of the colorant, the color reproduction region was markedly expanded.

Example 3

Image samples 3-1-1 and 3-1-2 were prepared in a manner similar to sample 1-1 of Example 1, provided that a phosphor having an emission peak at 350 nm or 540 nm was further incorporated into the yellow toner. Samples were evaluated similarly to Example 1 and the results thereof are shown in Table 3-1-1.

TABLE 3-1-1

| Sample No. | Phosphor Emission peak | Increment in L*a*b* space |
|---|---|---|
| 1-1 (Comp) | — | 0 (%) |
| 3-1-1 (Comp) | 350 nm | 0 |
| 3-1-2 (Inv) | 540 nm | 2.3 |

As can be seen from Table 3-1-1, incorporation of a phosphor having an emission peak in the 500–600 nm region increased the color reproduction region, resulting in brightly and clearly colored images.

Image samples 3-1-3 and 3-1-5 were prepared in a manner similar to sample 1-1 of Example 1, provided that a phosphor having an emission peak at 350, 450 or 540 nm was further incorporated into the cyan toner. Samples were evaluated similarly to Example 1 and the results thereof are shown in Table 3-1-2.

TABLE 3-1-2

| Sample No. | Phosphor Emission peak | Increment in L*a*b* space |
|---|---|---|
| 3-1-3 (Comp) | 350 nm | 0 |
| 3-1-4 (Inv) | 450 nm | 2.1 |
| 3-1-5 (Inv) | 540 nm | 3.8 |

As can be seen from Table 3-1-2, incorporation of a phosphor having an emission peak in the region of 400 to 500 nm or 500 to 600 nm increased the color reproduction region, resulting in brightly and clearly colored images.

Image samples 3-1-6 and 3-1-8 were prepared in a manner similar to sample 1-1 of Example 1, provided that a phosphor having an emission peak at 350, 450 or 610 nm was further incorporated into the magenta toner. Samples were evaluated similarly to Example 1 and the results thereof are shown in Table 3-1-3.

TABLE 3-1-3

| Sample No. | Phosphor Emission peak | Increment in L*a*b* space |
|---|---|---|
| 3-1-6 (Comp) | 350 nm | 0 |
| 3-1-7 (Inv) | 450 nm | 2.7 |
| 3-1-8 (Inv) | 610 nm | 3.8 |

As can be seen from Table 3-1-3, incorporation of a phosphor having an emission peak in the region of 400 to 500 nm or 600 to 700 nm increased the color reproduction region, resulting in brightly and clearly colored images.

Image samples 3-2-1 and 3-2-3 were prepared in a manner similar to sample 1-1 of Example 1, provided that a phosphor having an emission peak and a Stokes shift, as shown in Table 3-2-1 was further incorporated into the yellow toner. Samples were evaluated similarly to Example 1 and the results thereof are shown in Table 3-2-1.

TABLE 3-2-1

| Sample No. | Phosphor Emission | Phosphor Absorption | Stokes shift |
|---|---|---|---|
| 3-2-1 | 450 nm | 445 nm | 5 nm |
| 3-2-2 | 450 nm | 400 nm | 50 nm |
| 3-2-3 | 450 nm | 250 nm | 150 nm |

As can be seen from Table 3-2-1, when a phosphor having an emission peak in the 400–500 nm region is incorporated, the use of a phosphor exhibiting a Stokes shift of 10 to 100 nm (sample 3-2-2) resulted in more brightly and clearly colored images.

Image samples 3-2-4 and 3-2-6 were prepared in a manner similar to sample 1-1 of Example 1, provided that a phosphor having an emission peak and a Stokes shift, as shown in Table 3-2-2 was further incorporated into the cyan toner. Samples were evaluated similarly to Example 1 and the results thereof are shown in Table 3-2-2.

TABLE 3-2-2

| Sample No. | Phosphor Emission | Phosphor Absorption | Stokes shift |
|---|---|---|---|
| 3-2-4 | 540 nm | 535 nm | 5 nm |
| 3-2-5 | 540 nm | 400 nm | 140 nm |
| 3-2-3 | 540 nm | 290 nm | 250 nm |

As can be seen from Table 3-2-2, when a phosphor having an emission peak in the 500–600 rim region is incorporated, the use of a phosphor exhibiting a Stokes shift of 100 to 200 nm (sample 3-2-5) resulted in more brightly and clearly colored images.

Image samples 3-2-7 and 3-2-9 were prepared in a manner similar to sample 1-1 of Example 1, provided that a phosphor having an emission peak and a Stokes shift, as shown in Table 3-2-2 was further incorporated into the magenta toner. Samples were evaluated similarly to Example 1 and the results thereof are shown in Table 3-2-3.

TABLE 3-2-3

| Sample No. | Phosphor Emission | Phosphor Absorption | Stokes shift |
|---|---|---|---|
| 3-2-7 | 610 nm | 605 nm | 5 nm |
| 3-2-8 | 610 nm | 400 nm | 210 nm |
| 3-2-9 | 610 nm | 260 nm | 350 nm |

As can be seen from Table 3-2-3, when a phosphor having an emission peak in the 600–700 nm region was incorporated, the use of a phosphor exhibiting a Stokes shift of 200 to 300 nm (sample 3-2-8) resulted in more brightly and clearly colored images.

Example 4

Image samples 4-1 to 4-3 were prepared in a manner similar to sample 1-1 of Example 1, provided that a phosphor having an excitation peak at 405 nm and an emission peak at 540 nm was further incorporated in an amount shown in Table 4-1 into a yellow toner having an absorption peak at 435 nm, . Samples were evaluated similarly to Example 1 and the results thereof are shown in Table 4-1.

TABLE 4-1

| Sample No. | Colorant Absorption | Phosphor Excitation | Phosphor Emission | Amount | Absorption Variation | Increment in L*a*b* space |
|---|---|---|---|---|---|---|
| 4-1 | 435 nm | 405 nm | 540 nm | 1% | 99.2% | 1.4 |
| 4-2 | 435 | 405 | 540 | 3 | 97.4 | 5.8 |
| 4-3 | 435 | 405 | 540 | 5 | 90.7 | 17.9 |

In the Table, "Absorption Variation" indicates a variation (%) of the absorption of the yellow toner in the region of more than 500 nm, based on the absorption of the colorant. As can be seen from Table 4-1, when the amount of the phosphor was so controlled that the absorption variation in the region of more than 500 nm was 98% or less (sample 4-2 and 4-3), the color reproduction region was markedly expanded, resulting in more brightly and clearly colored images.

Image samples 4-4 to 4-6 were prepared in a manner similar to sample 1-1 of Example 1, provided that a phosphor having an excitation peak at 405 nm and an emission peak at 610 nm was further incorporated into a magenta toner having an absorption peak at 570 nm, in amount shown in Table 4-2. Samples were evaluated similarly to Example 1 and the results thereof are shown in Table 4-2.

TABLE 4-2

| Sample No. | Colorant Absorption | Phosphor Excitation | Phosphor Emission | Amount | Absorption Variation | Increment in L*a*b* space |
|---|---|---|---|---|---|---|
| 4-4 | 570 nm | 405 nm | 610 nm | 1.5% | 99.3% | 1.8 |
| 4-5 | 570 | 405 | 610 | 3.5 | 97.1 | 10.5 |
| 4-6 | 570 | 405 | 610 | 5.5 | 91.3 | 43.9 |

In the Table, "Absorption Variation" indicates a variation (%) of the absorption of the magenta toner in the region of 400–500 nm and 600–700 nm, based on the absorption of the colorant itself. As can be seen from Table 4-2, when the amount of the phosphor was so controlled that the absorption variation in the region of 400–500 nm and 600–700 nm was 98% or less (sample 4-5 and 4-6), the color reproduction region was markedly expanded, resulting in more brightly and clearly colored images.

Image samples 4-7 to 4-9 were prepared in a manner similar to sample 1-1 of Example 1, provided that a phosphor having an excitation peak at 405 nm and an emission peak at 502 nm was further incorporated into a cyan toner having an absorption peak at 660 nm, in amount shown in Table 4-3. Samples were evaluated similarly to Example 1 and the results thereof are shown in Table 4-3.

TABLE 4-3

| Sample No. | Colorant Absorption | Phosphor Excitation | Phosphor Emission | Amount | Absorption Variation | Increment in L*a*b* space |
|---|---|---|---|---|---|---|
| 4-7 | 660 nm | 405 nm | 502 nm | 1% | 99.6% | 2.0 |
| 4-8 | 660 | 405 | 502 | 3 | 97.0 | 8.9 |
| 4-9 | 660 | 405 | 502 | 5 | 91.5 | 24.5 |

In the Table, "Absorption Variation" indicates a variation (%) of the absorption of the cyan toner in the region of less than 600 nm, based on the absorption of the colorant itself. As can be seen from Table 4-3, when the amount of the phosphor was so controlled that the absorption variation in the region of less than 600 nm was 98% or less (sample 4-8 and 4-9), the color reproduction region was markedly expanded, resulting in more brightly and clearly colored images.

Example 5

Image sample 5-1 having a yellow color, magenta color, cyan color and a mixed color of yellow, magenta and cyan was prepared, using a color ink-jet printer, BJF 600 (available from Cannon Corp.), genuine inks (BC-30, BC-31) and genuine driver. Color images were recorded on Konica Photo Jet Paper Photolike QP (double weight, glossy paper) according to ISO/JIS-SCID sample S7 to S10 as output images. Image samples 5-2 and 5-3 were prepared in a manner similar to sample 5-1, provided that a phosphor having an emission peak at 350 nm or 502 nm was further incorporated into the cyan ink. The thus obtained image samples were visually evaluated, and the color reproduction range volume in the L*a*b* color space was determined for each sample in a manner similar to Example 1. The results thereof are shown in Table 5 below.

TABLE 5

| Sample No. | Phosphor (emission peak) | Increment in L*a*b* space |
|---|---|---|
| 5-1 (Comp) | — | 0 (%) |
| 5-2 (Comp) | 350 nm | 0 |
| 5-3 (Inv) | 502 nm | 10.2 |

As can be seen from Table 5, incorporation of a phosphor having an emission peak in the visible region (502 nm) increased the color reproduction region, resulting in brightly and clearly colored images.

What is claimed is:

1. A color image forming method comprising applying additive color mixing to a subtractive color mixture to perform color correction, wherein a fluorescent substance exhibiting emission in the visible light wavelength region is used for the additive color mixing and mixed with a compound having an absorption in the visible light wavelength region to form a mixture, and wherein said fluorescent substance exhibits emission in the wavelength region of an unwanted absorption of said compound having an absorption in the visible region.

2. The method of claim 1, wherein said fluorescent substance is mixed in an amount that gives not less than −0.3 with respect to an absorbance of the mixture.

3. The method described of claim 1, wherein said compound having an absorption in the visible region is a colorant.

4. The method of claim 1, wherein said fluorescent substance is so mixed that an absorption in an unwanted absorption wavelength region is reduced to not more than 98% by area.

5. The method of claim 1, wherein said compound having an absorption in the visible region exhibits an absorption having a main absorption peak and an absorption peak in an unwanted wavelength region, and said fluorescent substance is so mixed that the absorption peak in an unwanted wavelength region is reduced to not more than 98% by height.

6. The method described of claim 1, wherein the compound having an absorption in the visible region has a single absoption peak, including absorption in an unwanted wavelength region, and the fluorescent substance is so mixed that a half-width of the absorption of the compound is reduced to not more than 99.5%.

7. The method of claim 1, wherein the exciting light wavelength of the fluorescent substance is in the range of 350 to 420 nm.

8. The method of claim 1, wherein said fluorescent substance exhibits an emission having a peak at a wavelength of 400 to 500 nm.

9. The method of claim 1, wherein said fluorescent substance exhibits an emission having a peak at a wavelength of 500 to 600 nm.

10. The method of claim 1, wherein said fluorescent substance exhibits an emission having a peak at a wavelength of 600 to 700 nm.

11. The method of claim 1, wherein said fluorescent substance exhibits an emission having a Stokes shift of not less than 10 nm.

12. The method of claim 8, wherein said fluorescent substance exhibits an emission having a Stokes shift of 10 to 100 nm.

13. The method of claim 9, wherein said fluorescent substance exhibits an emission having a Stokes shift of 100 to 200 nm.

14. The method of claim 10, wherein said fluorescent substance exhibits an emission having a Stokes shift of 200 to 300 nm.

15. The method of claim 3, wherein said colorant exhibits yellow color, and said fluorescent substance is so mixed that an absorption in the wavelength region of not less than 500 nm is reduced to not more than 98%.

16. The method of claim 3, wherein said colorant exhibits magenta color, and said fluorescent substance is so mixed that an absorption in the wavelength region except for 500 to 600 nm is reduced to not more than 98%.

17. The method of claim 3, wherein said colorant exhibits cyan color, and said fluorescent substance is so mixed that an absorption in the wavelength region of not more than 600 nm is reduced to not more than 98%.

18. The method of claim 1, wherein said fluorescent substance is an inorganic phosphor.

19. The method of claim 1, wherein said fluorescent substance contains at least an oxygen atom.

20. A color image forming method comprising forming plural elements on a support, wherein the picture elements each comprise a fluorescent substance and a colorant, said fluorescent substance exhibiting an emission in the wavelength region of an unwanted absorption of said colorant.

21. A color image forming method comprising:
  (a) preparing an image forming material and
  (b) imagewise providing the prepared image forming material onto a support,
  wherein the image forming material comprises a fluorescent substance and a colorant, said fluorescent substance exhibiting an emission in the wavelength region of an unwanted absorption of said colorant.

22. The method of claim 21, wherein the step (b) comprises transferring the image forming material onto a support.

23. The method of claim 21, wherein the step (b) comprises at least one of the following (c) to (h):
  (c) allowing an organic photoconductor to be charged,
  (d) exposing an organic photoconductor to light,
  (e) allowing the image forming material to be adsorbed onto an organic photoconductor,
  (f) allowing the image forming material to transfer from an organic photoconductor to an intermediate receiving material,
  (g) (c), (d) or (e) being conducted for each of yellow, magenta, cyan and black colors, and
  (h) allowing the image forming material on the intermediate receiving material to transfer onto a support.

24. The method of claim 21, wherein the step (b) comprises spraying the image forming material on a support.

25. The method of claim 21, wherein step (b) comprises at least one of the following (i), (j) and (k):
  (i) ejecting the image forming material through a nozzle of a recording head,
  (j) allowing the ejected image forming material to adsorb onto a support, and
  (k) (i) or (j) being conducted for each of yellow, magenta, cyan and black colors.

* * * * *